US011105988B2

(12) United States Patent
Liang et al.

(10) Patent No.: US 11,105,988 B2
(45) Date of Patent: Aug. 31, 2021

(54) DENSE WAVELENGTH DIVISION MULTIPLEXING (DWDM) PHOTONIC INTEGRATION PLATFORM

(71) Applicant: Hewlett Packard Enterprise Development LP, Houston, TX (US)

(72) Inventors: Di Liang, Santa Barbara, CA (US); Zhihong Huang, Palo Alto, CA (US); Geza Kurczveil, Santa Barbara, CA (US); Raymond G. Beausoleil, Seattle, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/457,776

(22) Filed: Jun. 28, 2019

(65) Prior Publication Data
US 2020/0409001 A1    Dec. 31, 2020

(51) Int. Cl.
*G02B 6/42* (2006.01)
*H04J 14/02* (2006.01)
(Continued)

(52) U.S. Cl.
CPC ....... *G02B 6/4215* (2013.01); *G02B 6/29329* (2013.01); *G02B 6/29343* (2013.01);
(Continued)

(58) Field of Classification Search
CPC ....... H01L 31/02327; H01L 31/035218; H01L 31/035209; H01L 31/107; H01L 31/1133;
(Continued)

(56) References Cited

U.S. PATENT DOCUMENTS 8,213,751 B1    7/2012 Ho et al.
9,755,753 B2    9/2017 Blumenthal
(Continued)

OTHER PUBLICATIONS

Dong, P. et al.; "Silicon Photonic Devices and Integrated Circuits"; Mar. 13, 2014; 14 pages.
(Continued)

*Primary Examiner* — Thomas A Hollweg
*Assistant Examiner* — Mary A El-Shammaa
(74) *Attorney, Agent, or Firm* — Sheppard Mullin Richter & Hampton LLP

(57) ABSTRACT

A Dense Wavelength Division Multiplexing (DWDM) photonic integration circuit (PIC) that implements a DWDM system, such as a transceiver, is described. The DWDM PIC architecture includes photonic devices fully integrating on a single manufacturing platform. The DWDM PIC has a multi-wavelength optical laser, a quantum dot (QD) laser with integrated heterogeneous metal oxide semiconductor (H-MOS) capacitor, integrated on-chip. The multi-wavelength optical laser can be a symmetric comb laser that generates two equal outputs of multi-wavelength light. Alternatively, the DWDM PIC can be designed to interface with a stand-alone multi-wavelength optical laser that is off-chip. In some implementations, the DWDM PIC integrates multiple optimally designed photonic devices, such as a silicon geranium (SiGe) avalanche photodetector (APD), an athermal H-MOS wavelength splitter, a QD photodetector, and a heterogenous grating coupler. Accordingly, fabricating the DWDM PIC includes a unique III-V to silicon bonding process, which is adapted for its use of SiGe APDs.

19 Claims, 11 Drawing Sheets

(51) Int. Cl.
| | |
|---|---|
| H01S 5/343 | (2006.01) |
| H01S 5/34 | (2006.01) |
| G02B 6/293 | (2006.01) |
| H01L 31/18 | (2006.01) |
| H01L 31/107 | (2006.01) |
| H01L 27/144 | (2006.01) |
| H01L 31/0352 | (2006.01) |
| H01S 5/02 | (2006.01) |
| H01S 5/22 | (2006.01) |
| H01L 31/0203 | (2014.01) |
| H01L 31/113 | (2006.01) |
| H01L 31/0232 | (2014.01) |
| H01S 5/30 | (2006.01) |
| H01S 5/026 | (2006.01) |
| H04B 10/80 | (2013.01) |
| H04B 10/40 | (2013.01) |
| H01S 5/065 | (2006.01) |
| H01S 5/02234 | (2021.01) |

(52) U.S. Cl.
CPC ........ *G02B 6/4286* (2013.01); *H01L 27/1443* (2013.01); *H01L 27/1446* (2013.01); *H01L 31/0203* (2013.01); *H01L 31/02327* (2013.01); *H01L 31/035218* (2013.01); *H01L 31/107* (2013.01); *H01L 31/1133* (2013.01); *H01L 31/1812* (2013.01); *H01S 5/0215* (2013.01); *H01S 5/0262* (2013.01); *H01S 5/02234* (2021.01); *H01S 5/0657* (2013.01); *H01S 5/22* (2013.01); *H01S 5/3009* (2013.01); *H01S 5/341* (2013.01); *H01S 5/343* (2013.01); *H04B 10/40* (2013.01); *H04B 10/801* (2013.01); *H04J 14/022* (2013.01)

(58) Field of Classification Search
CPC ............. H01L 31/1812; H01L 31/0215; H01S 5/0215; H01S 5/02228; H01S 5/0262; H01S 5/0657; H01S 5/22; H01S 5/3009; H01S 5/341; H01S 5/343; H04B 10/801; H04J 14/022; G02B 6/29329; G02B 6/29343; G02B 6/4286; G02B 6/4215
See application file for complete search history.

(56) References Cited

U.S. PATENT DOCUMENTS

| | | | | |
|---|---|---|---|---|
| 10,811,549 | B2* | 10/2020 | Kurczveil | G02B 6/29343 |
| 2017/0207600 | A1* | 7/2017 | Klamkin | G02B 6/12002 |
| 2018/0041743 | A1* | 2/2018 | Ellwood, Jr. | H04N 9/3179 |
| 2018/0269654 | A1* | 9/2018 | Zhang | H01S 5/14 |
| 2019/0011638 | A1 | 1/2019 | Soda | |
| 2019/0288132 | A1* | 9/2019 | Wang | H01L 31/0232 |

OTHER PUBLICATIONS

Grillanda, S. et al.; "Wavelength Locking of Silicon Photonics Multiplexer for DML -Based WDM Transmitter"; 2017.

Komljenovic, T. et al.; "Photonic Integrated Circuits Using Heterogeneous Integration on Silicon"; Dec. 2018; 12 pages.

* cited by examiner

Hybrid QD MOS mode-lock laser (DWDM source)

DENSE WAVELENGTH DIVISION MULTIPLEXING (DWDM) PHOTONIC INTEGRATION PLATFORM

CROSS REFERENCE TO RELATED APPLICATIONS

This application is related to co-owned U.S. Pat. No. 9,612,503 filed on Apr. 30, 2012, entitled "HYBRID MOS OPTICAL MODULATOR", which is hereby incorporated by reference herein in its entirety; co-pending and co-owned U.S. patent application Ser. No. 15/335,909 filed on Oct. 27, 2016 entitled "MULTI-WAVELENGTH SEMICONDUCTOR LASERS which is hereby incorporated by reference herein in its entirety.

DESCRIPTION OF RELATED ART

Dense Wavelength Division Multiplexing (DWDM) is an optical multiplexing technology used to increase bandwidth over existing fiber networks. DWDM typically consists of combining and transmitting multiple signals simultaneously, at different wavelengths, on the same fiber, thus multiplying the capacity of the physical medium. DWDM interconnects using nanophotonics, in general, can offer orders of magnitude improved bandwidth and energy efficiency than electrical interconnects. Emerging multi-core computing systems, which often require an interconnect fabric that provides high throughput at low power with a small footprint, may lend themselves to employ DWDM technology.

Furthermore, there are several advancements being made in the realm of photonics, such as photonic integrated circuits. As progress in optical networking systems continues, there may be potential benefits in leveraging developments in photonics towards further improving DWDM technology. For example, leveraging photonic integrated circuits may greatly improve the design of many DWDM-driven parts (e.g., realizing low-cost, compact optical functions). However, there are several challenges and design considerations involved with using photonic integrated circuits (IC), which has stifled advancements towards creating fully integrated DWDM microchips. One such challenge is associated with the integration of an optical source, such as a laser, on a photonic integrated circuit. As an example, integrating a laser onto a silicon chip may be hampered by an indirect bandgap, which causes difficulties in coupling the laser to Silicon-On-Insulator (SOI).

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1A:
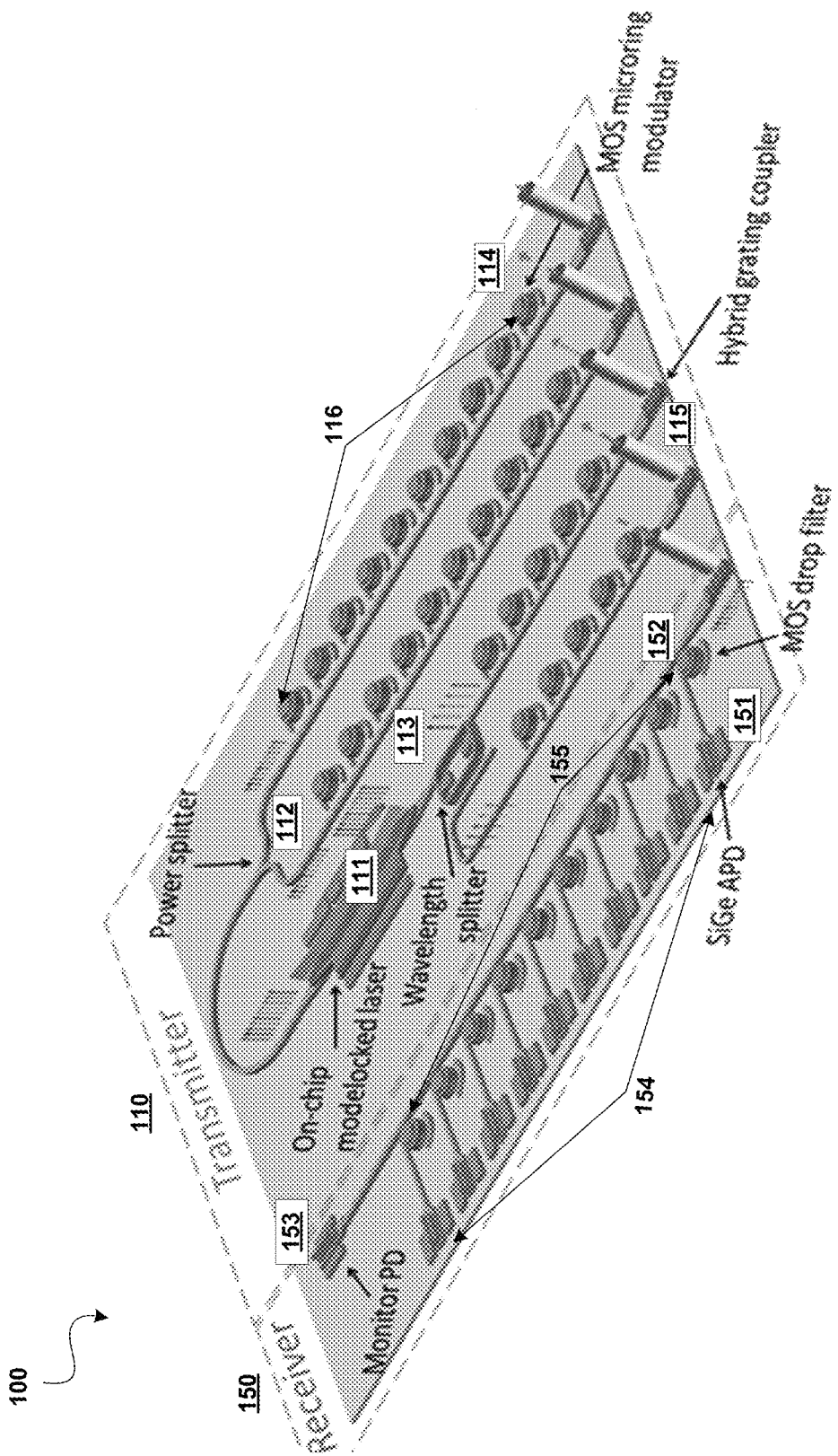
FIG. 1A depicts an example of a Dense Wavelength Division Multiplexing (DWDM) photonic integration circuit (PIC) having an optical laser integrated thereon for implementing a DWDM transceiver, according to some embodiments.

The figures are not exhaustive and do not limit the present disclosure to the precise form disclosed.

DETAILED DESCRIPTION

Various embodiments described herein are directed to a Dense Wavelength Division Multiplexing (DWDM) photonic integration circuit (PIC) and methods of fabricating the same. According to the embodiments, the DWDM PIC realizes the integration of multiple photonic devices on a shared platform. For example, photonic devices such as photodetectors, lasers, modulators, and the like, are often used to implement DWDM transceiver capabilities. In the DWDM PIC design, each of the photonic devices used are completely integrated on the platform, allowing these devices to be fabricated on a single integrated circuit (IC) chip (also referred to herein as "on-chip"). Moreover, in order to achieve such a high level of integration on-chip, the embodiments include methods for fabricating the DWDM PIC. As disclosed, the fabrication process includes a process that achieves bonding and layering of certain materials, such as silicon geranium (SiGe), Silicon (Si), and III-V materials in order to form these photonic devices, which typically do not coexist on a single chip. For example, fabricating the DWDM PIC includes the epitaxial growth of SiGe (for forming SiGe avalanche photodetectors), and the bonding of III-V (for forming a comb laser) to the same substrate. Accordingly, due to such a high level of integration on-chip, the DWDM PIC achieves a low-cost design, and provides compact optical functions.

Furthermore, many of the photonic devices, which are implemented together on DWDM PIC, are optimally designed at the individual component-level. Particularly, the disclosed DWDM PIC uniquely integrates metal-oxidesemiconductor (MOS) capacitors into several of its components, such as modulators and wavelength splitters, thereby enhancing their function. For example, during a fabrication process for the DWDM PIC, a wavelength splitter can be formed using certain materials (e.g., III-V material, dielectric, silicon) that also causes formation of a MOS capacitor to be integrated therein. The particular structure of the MOS capacitor lends itself for "zero" power wavelength tuning, and high-speed phase modulation. Consequently, by leveraging these MOS capacitors through component-level integration, the DWDM PIC can realize higher speed modulation and athermal tuning. For instance, the wavelength splitter (also referred to herein as an interleaver) having an integrated MOS capacitor, can provide performance enhancing characteristics to the platform, such as low crosstalk. Additionally, the DWDM PIC design includes other optimized photonic devices, such as heterogenous III-V on Silicon (Si) grating couplers, and higher sensitivity silicon geranium (SiGe) photodetectors. By integrating photonic devices that are independently design-optimized, the DWDM PIC extends these enhancements to its overall performance. Thus, the DWDM PIC realizes several advantages, such as higher energy efficiency, larger data bandwidth, and lower integration costs, over many existing DWDM transceiver chips.

Now referring to FIG. 1A, an example of a circuit architecture used to implement the disclosed DWDM PIC 100 is shown. As alluded to above, DWDM-based optical communications has several advantages in comparison to electrical communications. For example, DWDM technology allows for the transmission of optical signals at multiple wavelengths carrying multiple channels of information, thereby increasing the amount of information that can be transmitted through a single optical fiber (without interference). Thus, with DWDM, there can be little spacing between channels. Therefore, wavelengths can be placed in close proximity to each other, which in turn allows for a large amount of information to be included in a low loss fiber window to increase data transmissions, instead of increasing the number of fibers user. Potentially, a transceiver implementing DWDM technology may achieve high data rate transmissions via a single optical fiber. The DWDM PIC 100 in the illustrated example is configured to be a component for optical transmission, namely an optical transceiver, that operates in accordance with DWDM technology standards.

FIG. 1A serves to illustrate that the DWDM PIC 100 can be generally described as including two principal sections, shown as transmitter section 110 and a receiver section 150 (represented in FIG. 1A by dashed line boxes). The transmitter section 110 and the receiver section 150 can be distinct regions of DWDM PIC 100. For instance, in the example architecture, the sections 110, 150 are shown to be situated on opposing sides of the platform. Further, FIG. 1A shows that the transmitter section 110 can include several photonic devices integrated on the platform, including: an on-chip mode-locked laser 111; a power splitter 112; a wavelength splitter 113; multiple MOS micro-ring modulators 114; and multiple heterogenous grating couplers 115. Additionally, in FIG. 1A, the receiver section 150 includes photonic devices, including: multiple SiGe avalanche photodetectors (APDs) 151; multiple MOS drop filters 152; and a monitor PD 153. It should be appreciated that sections 110 and 150 are also a logical groupings of the photonic devices that are integrated on the platform by their function. In other words, the devices comprising the transmitter section 110 of the DWDM PIC 100 can implement the transmission capabilities of the DWDM transceiver, and the devices in the receiver section 150 can implement the optical receiving capabilities of the DWDM transceiver.

Even further, FIG. 1A illustrates an unique feature of the DWDM PIC 100, which is the integration platform. The architecture for the DWDM PIC 100, as seen in FIG. 1A, fully integrates all of the photonic components (used to implement DWDM transceiver functions) on a single fabricated IC chip. Also, the on-chip mode-locked laser 111 can include an amplifier (not shown). Another distinct feature of the DWDM PIC 100 involves its capability to produce more channels for optical communication, by integration of the amplified on-chip mode-locked laser 111 in conjunction with splitters, namely power splitter 112 and wavelength splitter 113. As such, the DWDM PIC 100 can achieve multiple channels by using an approach that may significantly reduce the design cost, reduce the hardware footprint, and improve energy efficiency, in comparison to other brute-force approaches (e.g., adding several additional lasers/optical sources) that are currently used.

Also, FIG. 1A shows an example of the DWDM PIC 100 which is specifically designed to integrate an on-chip mode-locked laser 111. The on-chip mode-locked laser 111 can be configured to generate multiple wavelengths of light (represented in FIG. 1A by the upward arrows from the laser 111). In some cases, the on-chip mode-locked laser 111 is implemented as a monolithic comb laser with an amplifier. FIG. 1A shows the on-chip mode-locked laser 111 as an symmetric comb laser that can produce two equal outputs, or light at the same multiple wavelengths. In generally, lasers are designed to emit light from one side, instead of two-sides. For example, a laser can have a high reflection mirror on one side to force the light to come out of the opposite side. In the case of a symmetric comb laser, as seen in FIG. 1A, the two equal outputs can form multi-wavelength streams, which splits the output into to two routes. Thus, integrating a symmetric comb laser into the design (as the on-chip mode-locked laser 111) can increase the number of multi-wavelength streams produced by the DWDM PIC 100 without using additional power. Furthermore, the on-chip mode-locked laser 111 can be an quantum dot (QD) laser having a heterogenous metal oxide semiconductor (H-MOS) capacitor integrated in its laser cavity, for example.

Figure 4A:
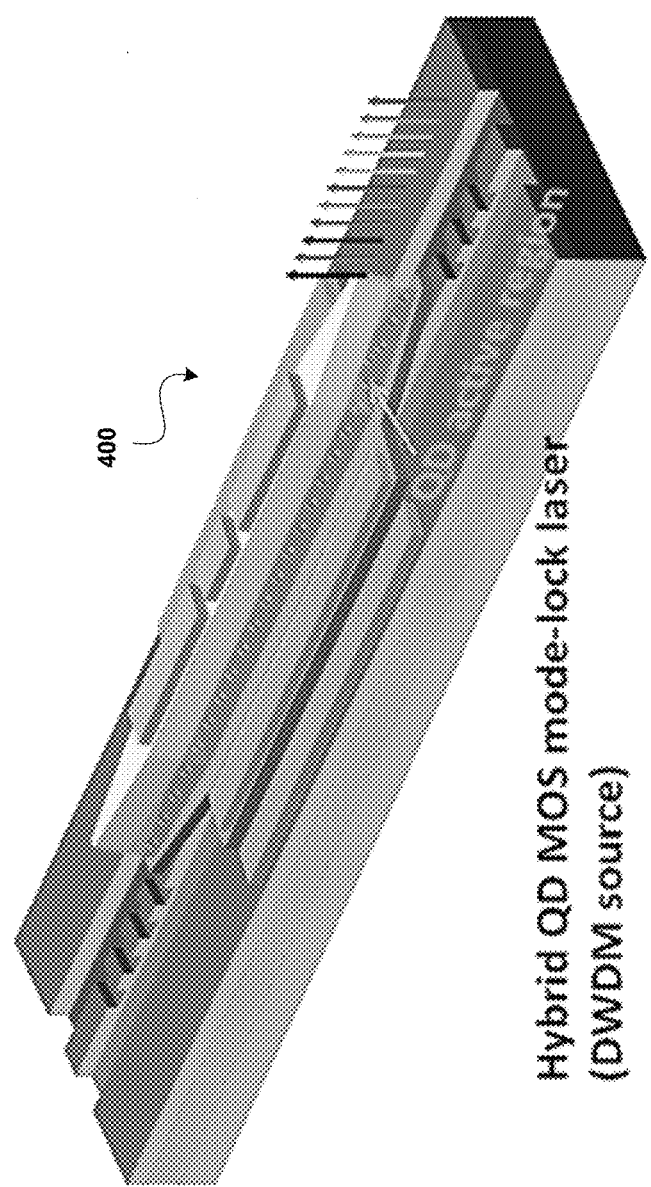
FIG. 4A illustrates an example of an quantum dot (QD) laser having an integrated H-MOS capacitor that can be integrated into the DWDM PIC, according to some embodiments.
Figure 4B:
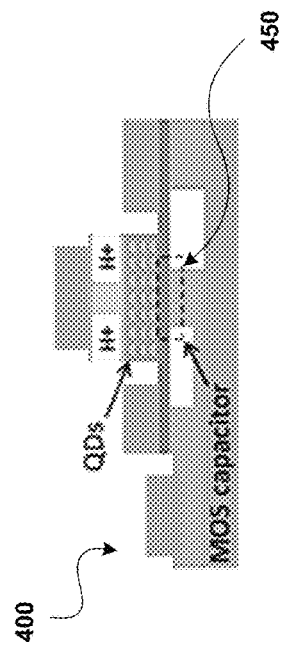
FIG. 4B illustrates a cross-sectional view of QD laser having an integrated H-MOS capacitor that can be integrated into the DWDM PIC, according to some embodiments.

FIGS. 4A-4B serve to prominently illustrate an example of a QD laser 400 with integrated H-MOS capacitor that can be employed as the optical source in the disclose platform and its configuration. As seen in FIG. 4B, an H-MOS capacitor 450 is integrated into the laser. The integration of the H-MOS capacitor in a QD laser may implement, or otherwise improve, certain aspects the QD laser's 400 function. For example, the H-MOS capacitor 450 may enable the QD laser 400 to lock comb lines. The H-MOS capacitor 450 can stabilize the QD laser 400, such that wavelengths can be fixed to certain grades, and not fluctuate over the temperature. Integrating the H-MOS capacitor 450 to the QD laser 400 can allow for more control, for instance with respect to tuning to certain wavelengths. According to embodiments, the H-MOS capacitor 450 may be formed by creating a layer of oxide (or other dielectric) between the lasing material, such as III-V, and silicon. By harnessing the capacitance properties that result from placing a dielectric between two semi-conductors, the H-MOS capacitor 450 can be easily formed between the III-V (a semi-conductive material) and the silicon (semi-conductive material) of the QD laser 400, during its fabrication.

Figure 3:
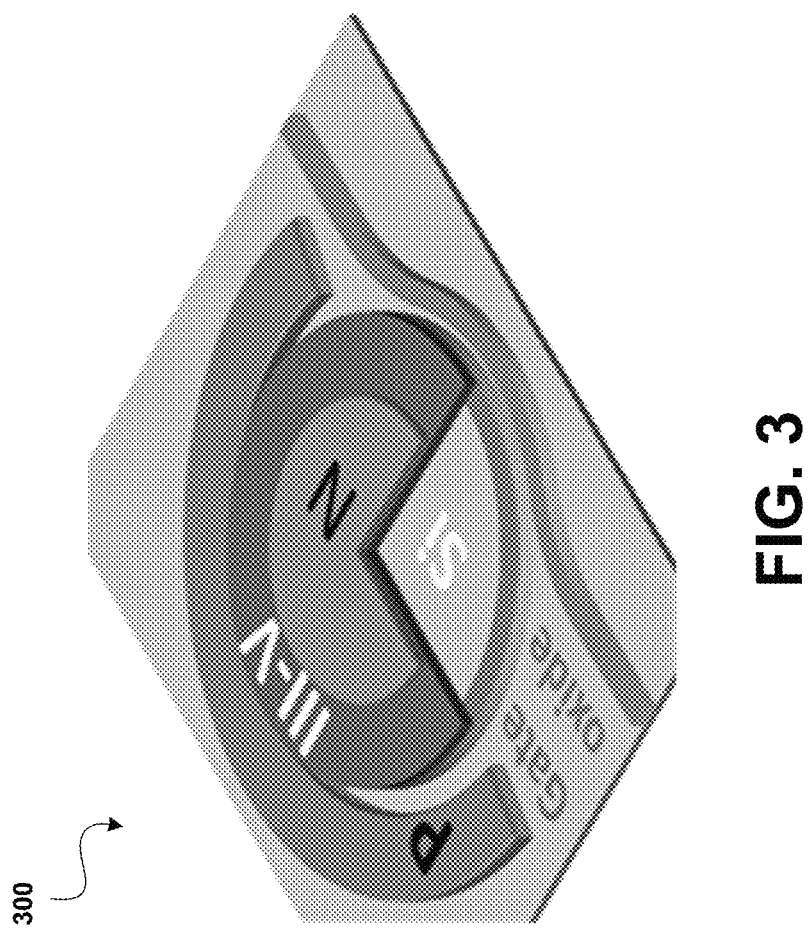
FIG. 3 illustrates an example of a heterogenous metal oxide semiconductor (H-MOS) capacitor that can be integrated into the DWDM PIC, according to some embodiments.

Further details regarding the QD laser is described in U.S. patent application Ser. No. 15/335,909 filed on Oct. 27, 2016 entitled "MULTI-WAVELENGTH SEMICONDUCTOR LASERS", which is hereby incorporated by reference herein in its entirety. Also, FIG. 3 serves to prominently illustrate an example of a H-MOS capacitor that is employed in the disclose platform and its configuration. Further details regarding the H-MOS capacitor is described in U.S. Pat. No. 9,612,503 filed on Apr. 30, 2012, entitled "HYBRID MOS OPTICAL MODULATOR", which is hereby incorporated by reference herein in its entirety.

Figure 1B:
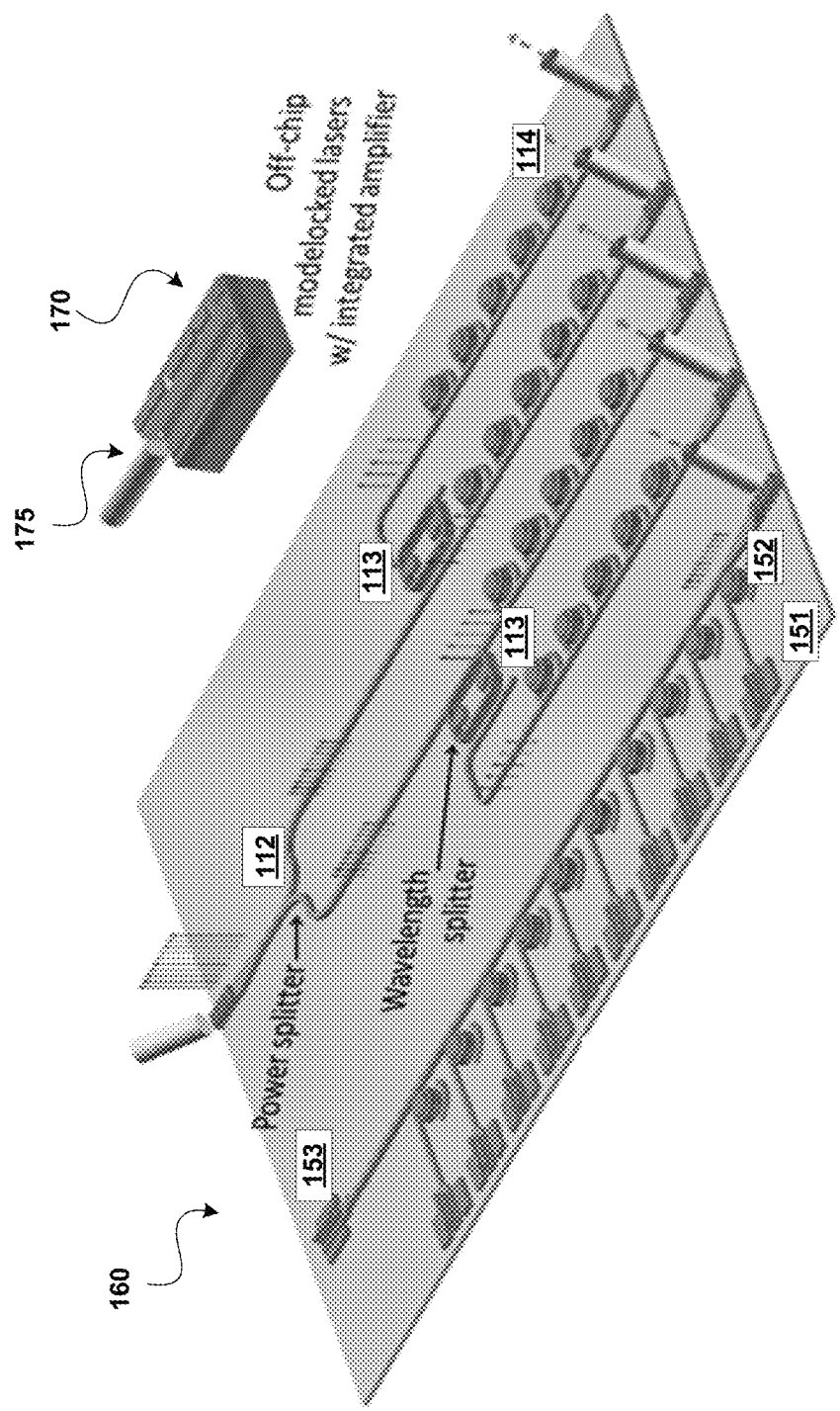
FIG. 1B depicts another example of a DWDM PIC for implementing a DWDM transceiver interfacing with a stand-alone optical laser, according to some embodiments.

Alternatively, FIG. 1B, illustrates another example of an DWDM PIC 160, where its architecture does not include the laser on-chip. FIG. 1B illustrates that the DWDM PIC 160 is configured to interface with an "off-chip" mode-locked laser 170. As such, the laser 170 can be considered a stand-alone laser, and the DWDM PIC 160 (without a laser integrated thereon) a heterogenous transceiver chip. The off-chip" mode-locked laser 170 can be integrated with an amplifier in a manner similar to the on-chip laser (shown in FIG. 1A). The DWDM PIC 160 includes substantially the same components and function as the DWDM PIC 100 that is described in detail with reference to FIG. 1A. Accordingly, the individual photonic devices integrated onto the DWDM PIC 160 and their functions are not described again in reference to FIG. 1B for purposes of brevity.

In comparing the DWDM PIC 100 having the on-chip laser (shown in FIG. 1A) and the DWDM PIC 160 interfacing with an off-chip laser (shown in FIG. 1B), it should be understood that there are some design tradeoffs between the implementations. With respect to performance, for instance, there may be substantially less optical loss experienced by light output from the laser (e.g., propagating to the wavelength splitter) by being integrated on-chip. In contrast, the stand-alone laser 170 may experience some loss from being coupled to an optical fiber 175 in order for the light to be received by the DWDM PIC 160. As a consequence, in some cases, the off-chip mode-locked laser 170 will have to compensate for this optical loss, by using more power or having increased bias.

The DWDM PIC 100 can also include a wavelength splitter 113. The wavelength splitter 113 can split the number of wavelengths. As an example, if there are 10 wavelengths produced by the laser 111, then the wavelength splitter 113 can send the odd numbered wavelengths to a modulator array 116 and the even numbered wavelengths to another modulator array 116. Accordingly, continuing with the example, the wavelength splitter 113 effectively creates two channels of wavelengths for modulation.

The DWDM PIC 100 can also include a power splitter 112 in its architecture. Generally, the power splitter 112 is configured to increase the number channels produced by the transmitter section 110 of the platform, similar to the above-mentioned wavelength splitter 113. The power splitter 112 can receive the multi-wavelength light output from the on-chip mode-locked laser 111. In response, the power splitter can split the power into half, for example, which effectively double the number of channels produces. The power splitter 112 is capable of performing a type of splitting, while maintaining the same number of wavelengths. It should be understood that the DWDM PIC 100 can be designed to include either one of the wavelength splitter 113 or the power splitter 112 in order to further create more multi-wavelength streams to expand the channel count. However, FIG. 1A shows an example configuration that integrates both the power splitter 112 and the wavelength splitter 113 onto the platform.

Figure 5:
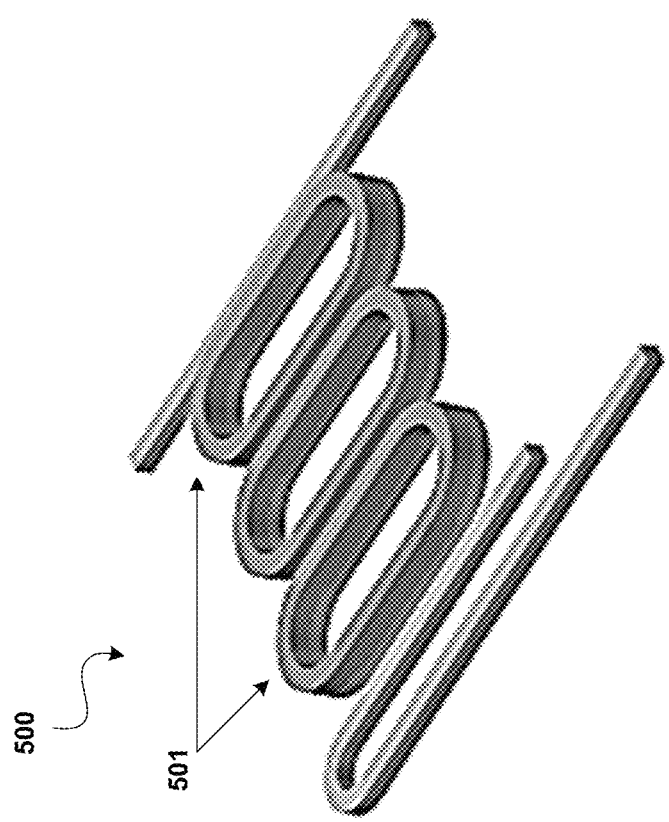
FIG. 5 illustrates an example of an athermal wavelength splitter that can be integrated into the DWDM PIC, according to some embodiments.

FIG. 5 serves to prominently illustrate an example of a wavelength splitter 500 that is employed in the disclose platform and its configuration. Referring now to FIG. 5, the DWDM PIC can include an athermal wavelength splitter 500. As seen, the athermal wavelength splitter 500 can be structured to include multiple rings 501 (comprised of semi-conductive material) that are coupled together. In the illustrated example, the athermal wavelength splitter 500 includes three rings 501 that are cascaded together, where each individual ring 501 has a lateral surface that is coupled to a proximally located ring 501. The athermal wavelength splitter 500 (also referring to herein as an H-MOS wavelength splitter) can include an integrated heterogenous metal oxide semiconductor (H-MOS) capacitor. The H-MOS capacitor is integrated to allow for control of the resonance of the rings 501. This added control allows the athermal wavelength splitter 500 to create multiple DWDM streams with larger channel spacing.

Often times, channels that are too tightly spaced (e.g., less than 40 GHz) may be susceptible to optical crosstalk between the adjacent channels, which can reduce the signal integrity at the received end. However, by employing multiple rings 501, the wavelength splitter 500 can interleave a set of wavelengths. In comparison, a wavelength splitter having one ring would have to rely solely on that single ring, thus having a very narrow window to drop a wavelength. The athermal wavelength splitter 500 can use its interleaving capabilities to drop a set of wavelengths, for instance dropping all of the odd number wavelengths. Accordingly, by dropping a set of wavelengths (e.g., half of the wavelengths) the athermal wavelength splitter 500 can effectively double the channel spacing. For instance, a signal having a 40 GHz spacing may be increased to 80 GHz spacing, by employing the athermal wavelength splitter 500. By achieving larger channel spacing, the athermal wavelength splitter 500 can mitigate the potential of crosstalk that may be associated with smaller channel spacings (e.g., generated by combs lasers), thereby improving the signal integrity. Furthermore, due to its athermal approach, the athermal wavelength splitter 500 can increase the number of multi-wavelength light streams, without disseminating heat that may have a negative impact (or unexpected thermal related effects) on other neighboring photonic devices that share the platform. Furthermore, by integrating the H-MOS capacitor to implement the drop filter spectrum, there is almost no energy consumption (e.g., negligible) associated with the athermal wavelength splitter 500. Some existing approaches, namely thermal wavelength splitting, can consume large amounts of energy in order to achieve the same spectrum realized by the athermal wavelength splitter 500 design.

Also shown in FIG. 1A, the DWDM PIC 100 can have multiple MOS micro-ring modulators 114 modulated thereon. As a general description, MOS micro-ring modulators 114 can encode electrical data onto an optical signal, and then output a modulated optical signal that can be sent to an optical port to be collected by an optical fiber for transmission. In the example of FIG. 1A, the DWDM PIC 100 includes modulator arrays 116 comprised of multiple individual micro-ring modulators 114. A modulator array 116 is shown as a row of multiple MOS micro-ring modulators 114. The DWDM PIC 100 in FIG. 1A includes four rows of MOS micro-ring modulators 114, or four modulator arrays 116.

Figure 6:
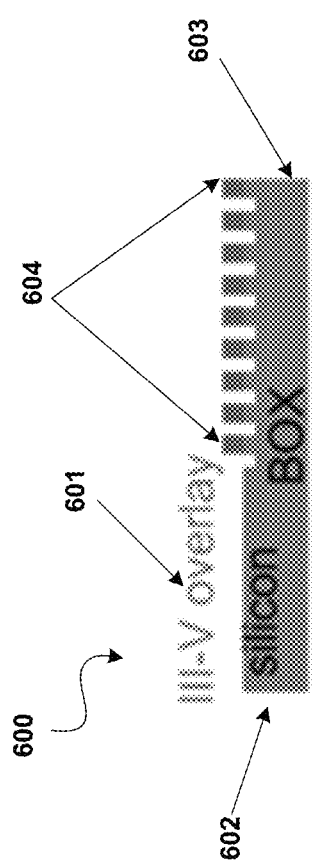
FIG. 6 illustrates an example of a heterogenous grating coupler (HGC) that can be integrated into the DWDM PIC, according to some embodiments.

The DWDM PIC 100 can also have multiple heterogenous grating couplers (HGC) 115 in its transmitter section 110. The HGCs 115 can be used as interfaces to the input/output ports of the DWDM PIC 100. According to the embodiments, the HGCs 115 are optimally designed in a manner that breaks symmetry and enhances directionality of the optical signal towards the optical fibers. Thus, integration of these distinctly designed hybrid grating couplers 115 can result in lower coupler loss and larger 1 dB bandwidth, and thereby further enhances the overall performance of the DWDM PIC 100. FIG. 6 serves to prominently illustrate the HGC 115 that is employed in the disclose integration platform and its configuration.

In referring to FIG. 6, the HGC 600 is illustrated to include an III-V overlay 601 on top of the silicon grating coupler. FIG. 6 shows that the HGC 600 is structured to include silicon 602 on top of a BOX 603, and grating 604. In general, the HGC 600 deflects light either upward, towards an optical fiber, or downwards, towards the BOX 603. In many existing grating couplers, there is additionally a silicon substrate that is beneath its BOX. The silicon substrate, in many cases, causes light to get lost within the substrate, which further leads to loss that may be experienced by the grating coupler. However, due to use of III-V overlay 601 over the grating coupler layer, the HGC 600 is designed to minimize the optical loss in the passive components. This III-V overlay 601 can break symmetry, such that the light will deflect more towards the optical fiber, and less towards the BOX 603 (and the substrate). As discussed in greater detail in reference to FIG. 8, fabricating the DWDM PIC utilizes III-V material in order to construct the integrated QD laser (e.g., wafer bonding III-V). This III-V material (already present in the platform) can then be leveraged to form a thin layer of III-V, thereby create the III-V overlay 601 over the HGC 600 to enhance its directionality. Thus, in operation the HGC 600, when the multi-wavelength light is transmitted through the HGC 600, there may be less variation in the coupling coefficient, resulting in lower coupling loss and improved bandwidth (e.g., 1 dB).

Figure 7B:
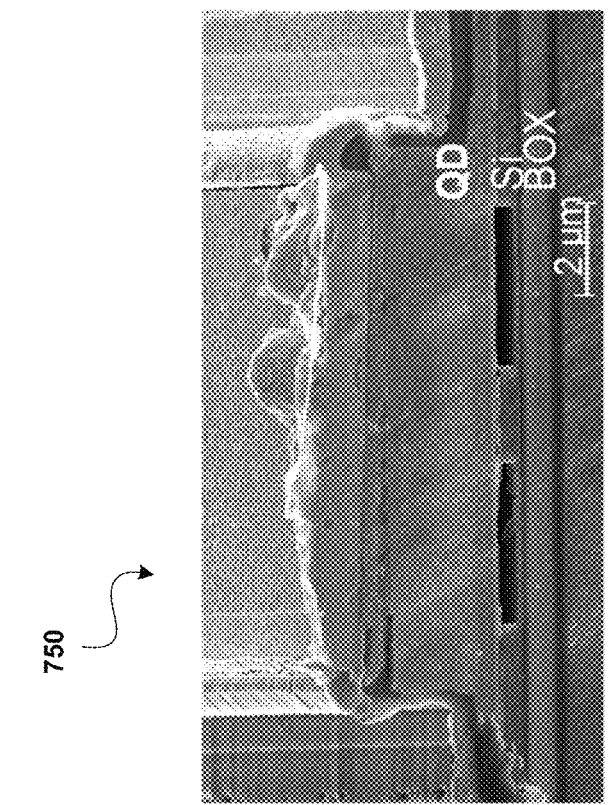
FIG. 7B depicts an example of a QD photodetector that can be integrated into the DWDM PIC, according to some embodiments.
Figure 7A:
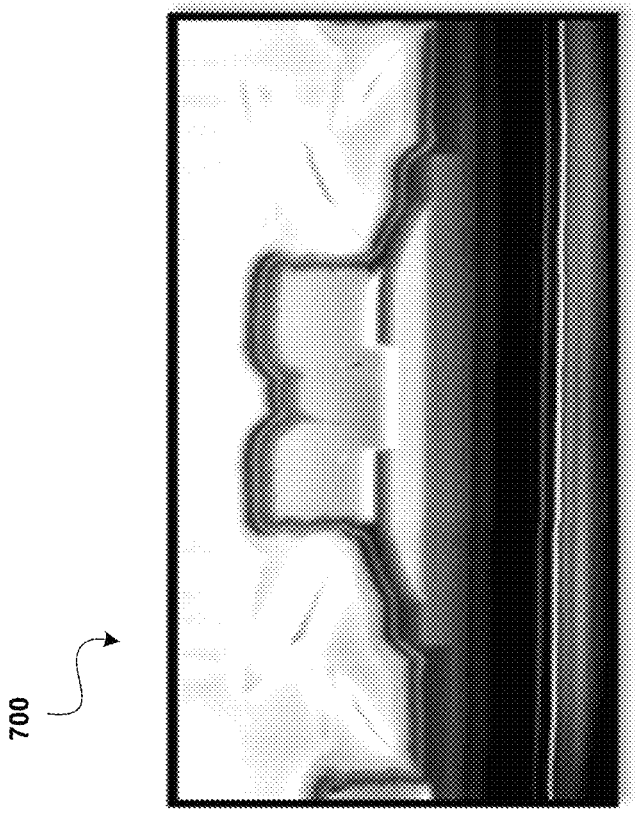
FIG. 7A depicts an example of a silicon geranium (SiGe) avalanche photodetector (APD) that can be integrated into the DWDM PIC, according to some embodiments.

Now, referring to the receiver portion 150 of FIG. 1A, multiple MOS drop filters 152 are shown to be integrated onto the platform. The MOS drop filters 152 may have substantially the same structure as MOS micro-ring modulators 114, but having a different function that relates to receiving optical signals. The MOS drop filters 152 can act as a filter, filtering each wavelength combined in an optical signal that is received by the receiver section 150. Furthermore, each MOS drop filter 152 is arranged to be generally aligned with a corresponding SiGe APD. Accordingly, each MOS drop filter 152 may be configured to output a filtered signal to be received by its corresponding SiGe APD 151. A SiGe APDs 151 can be configured to convert the received optical signal back to an electrical signal for additional signal processing by another electrical component, for example. As previously discussed, the SiGe APDs 151 are device that have been optically designed at the component-level for integration into the DWDM PIC 100. It should be appreciated that integration of SiGe APDs 151 into the disclosed design is an innovative approach, as their use is not ubiquitous for current products in industry. Even further, the disclosed SiGe APDs 151 have operational characteristics (e.g., less than 10 V breakdown voltage, up to 60 Gb/s PAM 4 modulation, 8 dB improved sensitivity) that can further improve the overall performance of the optical system (e.g., improves optical link energy efficiency and increase transmission speed). In addition, the monitor PD 153 may be implemented as a QD photodetector (as opposed to a SiGe APD). FIG. 7A serves to prominently illustrate an example of a SiGe APD 700 that can be employed in the disclose platform and its configuration. In addition, FIG. 7B serves to prominently illustrate an example of a QD photodetector 750 that can be employed in the disclose platform and its configuration.

The receiver section 150 can be further described as a SiGe APD array 154, shown as a row of multiple SiGe APDs 151. In addition, the multiple MOS drop filters 152 are arranged in a row, which can be described as a MOS drop filter array 155. Although FIG. 1A shows only one SiGe APD array 154 for purposes of illustration, it should be appreciated that multiple arrays of APDs may be used to correspondingly received each channel of information from the transmitter section 110. The receiver section can have a complimentary design, also having four SiGe APD arrays 154, where each SiGe array 154 respectively receives a channel output by each modulator array 116. In other words, the receiver section 150 can have a number of SiGe APD arrays 154 that corresponds to the number of modulator arrays 116 in the transmitter section 110 (e.g., both sections 11, 150 having four arrays).

Figure 2:
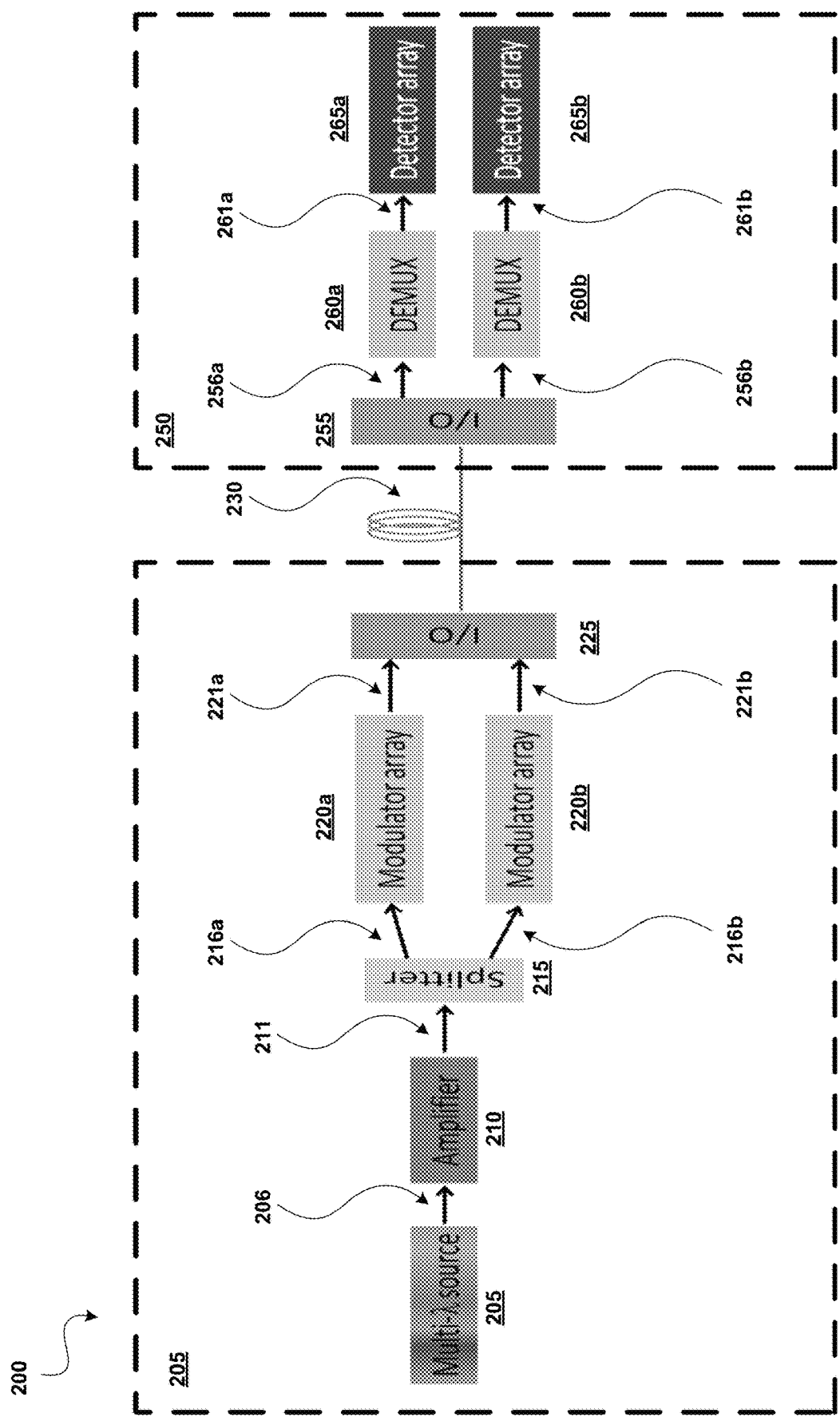
FIG. 2 is a conceptual diagram illustrating an example operational function of the DWDM PIC, according to some embodiments.

FIG. 2 illustrates a conceptual system 200, which, for purposes of discussion, generalizes the integration of elements and functions that can be realized together on a single platform, namely using the DWDM photonic integration platform (shown in FIGS. 1A-1B). The conceptual system 200 is illustrated as divided into a TX-side 205 and a RX-side 250, which parallels the TX portion and RX portion shown in the example architectures for the DWDM photonic integration platform. Generally, the TX-side 205 functions to transmit an optical signal across an optical fiber 230, which is subsequently received by the RX-side 250.

As seen in FIG. 2, the system 200 includes a multi-wavelength source 205. The multi-wavelength source 205 can be implemented using various mechanisms capable of generating light, such as lasers. Additionally, the multi-wavelength source 205 is capable of generating beams of light having multiple wavelengths (as commonly known in optics). For example, the multi-wavelength source 205 may be implemented as an array of single wavelength lasers, in some examples, or as a comb laser (shown in the platforms of FIGS. 1A-1B). In the illustrated example, a signal that is output 206 from the multi-wavelength source 205 can be received by an amplifier 210. The amplifier 210 can generate an amplified signal to serve as its output 211. As alluded to above, an important design aspect of the disclosed platform is the integration of wavelength splitters (or interleavers), generally illustrated as splitter 210 in FIG. 2, in order to create multiple DWDM streams. According to the embodiments, the splitter 215 is configured to take light at multiple different wavelengths, as its input. Then, the splitter 215 can separate components of the signal in manner that generates multiple channels as output, which is referred to herein as "splitting" the signal. Referring back to the example in FIG. 2, the splitter 215 can receive signal 211, and then split that signal into multiple channels. In particular, FIG. 2 shows the splitter 215 outputting two channels 216a and 216b, as a result of splitting the single signal 211, which is received from the amplifier 210. In some cases, splitter 215 may initially receive a certain number of signals (e.g., 2 input signals) and perform splitting to generate twice (2×) that number of channels for output streams (e.g., 4 output channels). Accordingly, the platform 200, by using the splitter 215, is cable of doubling (and in some instances tripling, or quadrupling) the number of channels that can be employed by the system 200 for optical transmission, which result from a single optical source, illustrated as the multi-wavelength source 205. Thus, the embodiments provide a platform 200 that can create more data channels for DWDM transmission, while using a minimal number of lasers (e.g., one comb laser). Wavelength splitters are discussed in greater detail in reference to FIG. 5.

Continuing with the example, the system 200 includes modulator arrays 220a, 220b that modulate (or encode) electrical signals onto the optical signal. In some embodiments, the number of modulator arrays can correspond to the number of channels produced by a splitter. For instance, FIG. 2 shows two modulator arrays 220a, 220b, which allows for each array to respectively receive one of the two channels 216a, 216b that are output from the splitter 215. As a result, modulated optical signals 221a, 221b cam then be output from the modulator arrays 220a, 220b, respectively. These modulated optical signals 221a,221b can be sent to an input/output (I/O) port 225 before leaving the TX-side 205 for transmission to a destination. A modulated optical signal that is output from the TX-side 205 can be transmitted via an optical fiber 230 that is coupled to an I/O port 255 at the RX-side 250.

On the RX-side 250, an optical signal can be initially received by the I/O port 225. The optical signals can be received using the same number of channels, or DWDM streams, that are generated at the TX-side and employed for transmission (e.g., two channels). Furthermore, the RX-side 250 can be configured for symmetry with the TX-side 205. In other words, the receiver includes a number of demodulators (DEMUX) that corresponds to the number of channels output by the RX-side 205. Subsequently, each channel 256a, 256b that is received at the RX-side 250 can be input into a corresponding demodulator (DEMUX). In the example, DEMUX 260a receives signal 256a, and similarly DEMUX 260b receives signal 256b. Then, DEMUXs 260a, 260b can stream the individual channels 261a, 262b (transmitted in the same optical fiber 230) to corresponding individual detector. In particular, FIG. 2 shows individual detector array 265a receiving a channel 261a that is output from DEMUX 260a; and individual detector array 265b receiving a channel 261b that is output from DEMUX 260b. Thus, as each channel, such as channels 261a, 261b, is handled by a separate photoreactor array, the channels can remain separated. Consequently, the system 200 is structured in manner that utilizes multiple DWDM channels (e.g., increased efficiency), but also lends itself to a separation of these channels at the receiver which mitigates the risk of interference, and further allows information that is uniquely conveyed on each channel to not be confused with a neighboring channel.

Figure 8:
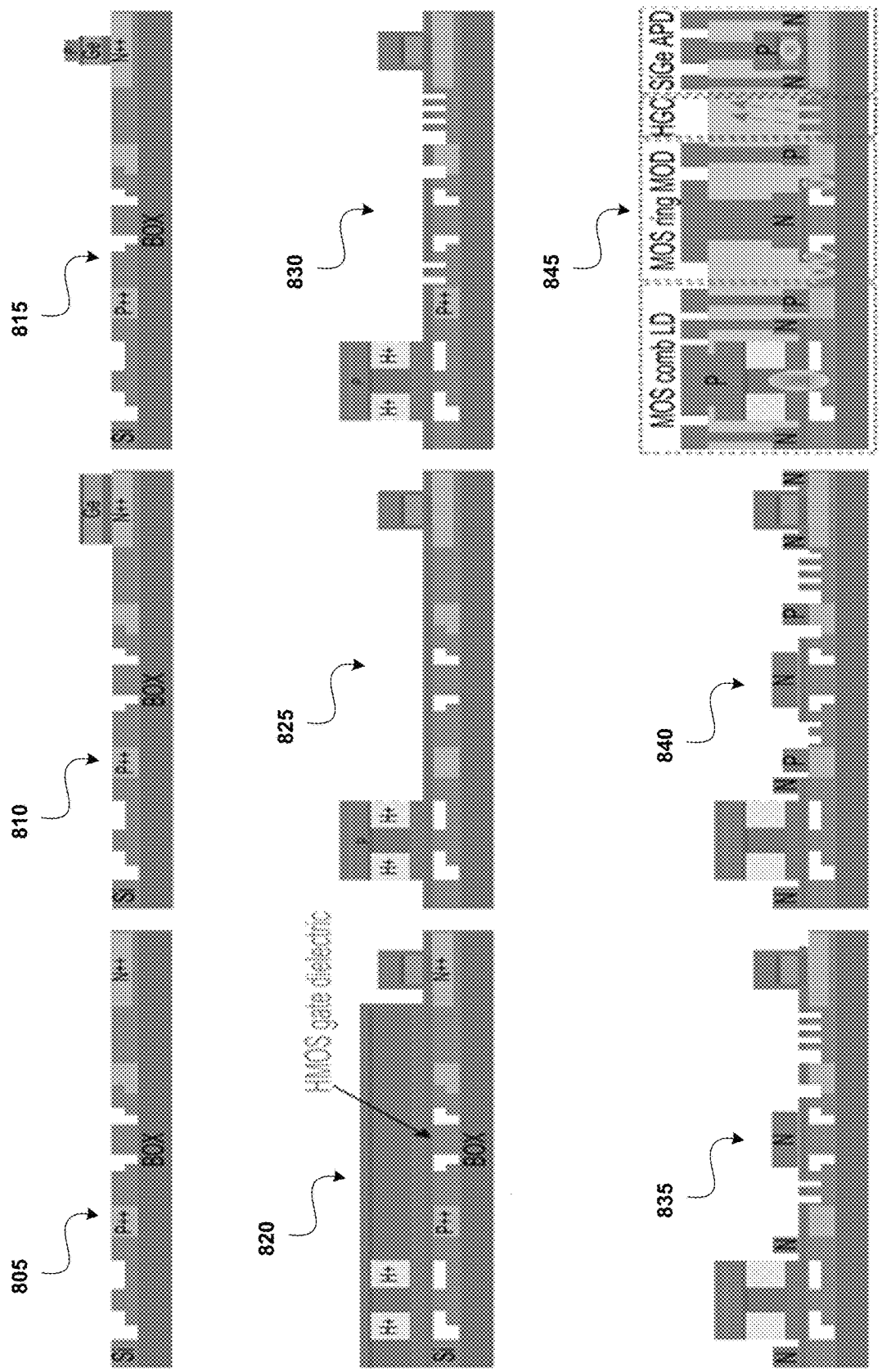
FIG. 8 depicts an example of a process for fabricating the DWDM PIC and each of the photonic device integrated thereon, according to some embodiments.
Figure 9A:
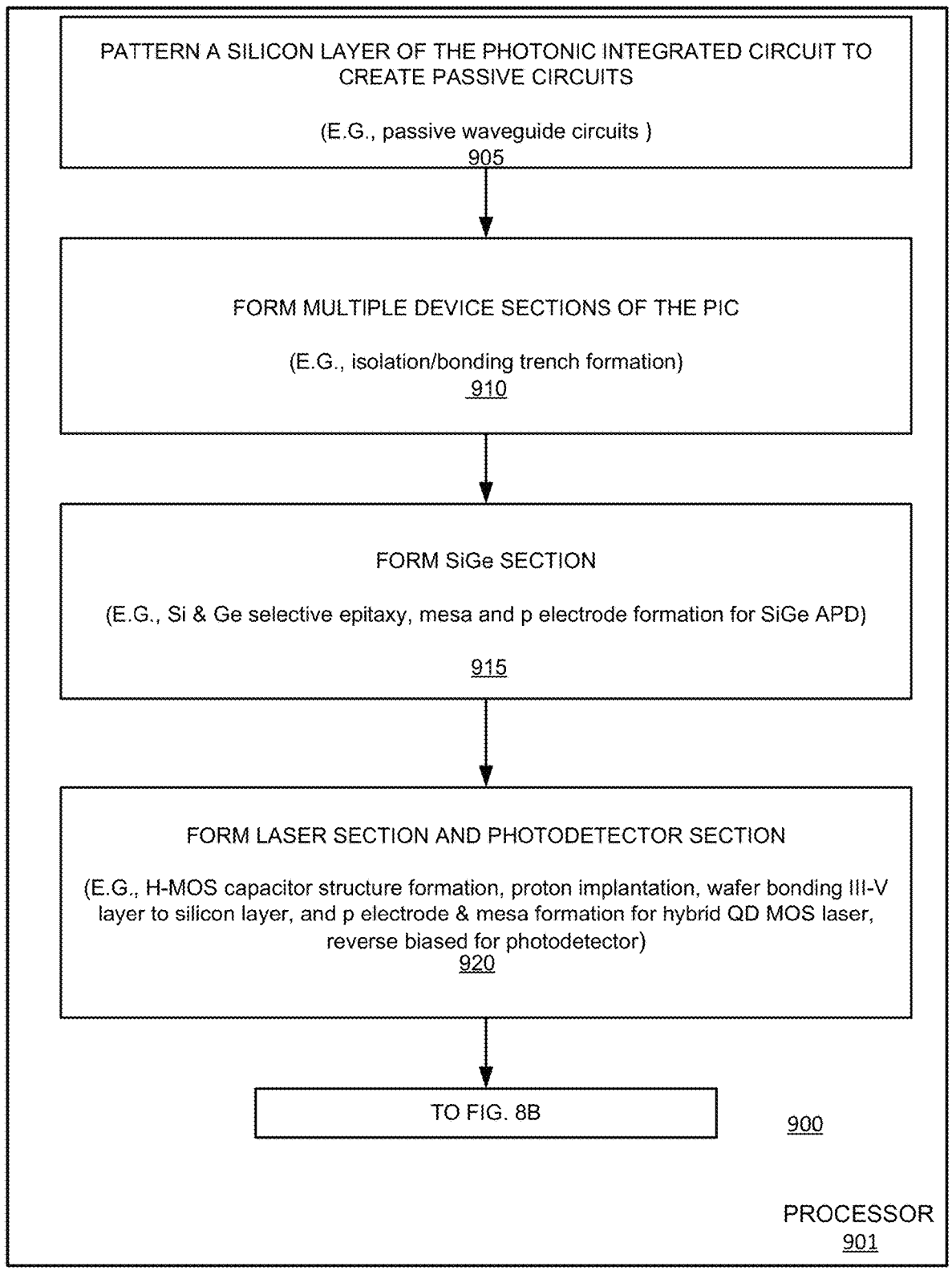
FIG. 9A is a flow diagram illustrating the process depicted in FIG. 8 for fabricating the DWDM PIC and each of the photonic device integrated thereon, according to some embodiments.
Figure 9B:
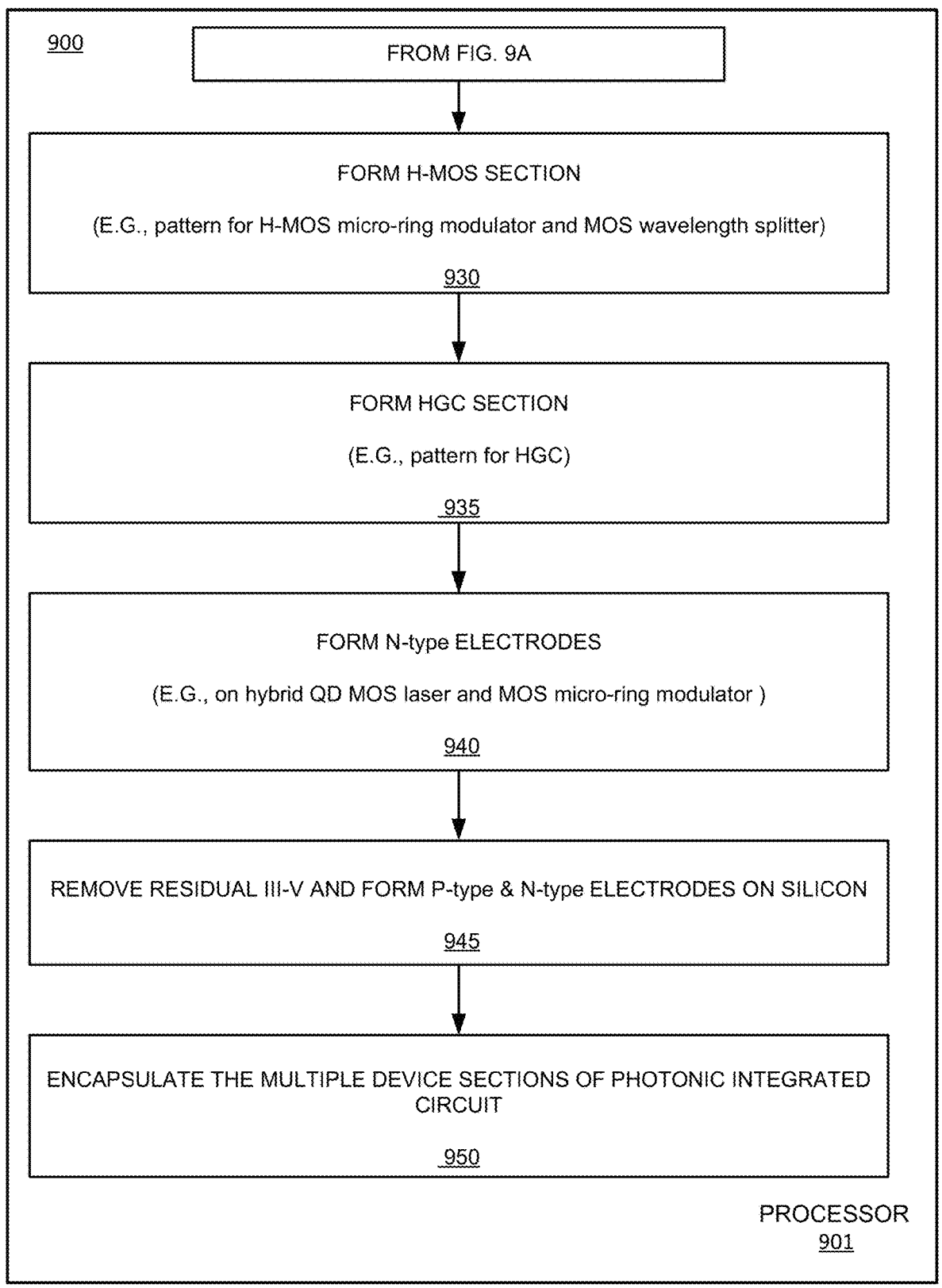
FIG. 9B is a flow diagram illustrating the process for fabricating the DWDM PIC continued from FIG. 9A, according to some embodiments.

Referring now to FIGS. 9A-9B, a flow diagram illustrating an example of a process for fabricating the DWDM PIC, illustrated in FIG. 1A for instance, is shown. Additionally, FIG. 8 depicts this fabrication process for the DWDM PIC as a series of diagrams. Each diagram shown in FIG. 8 illustrates an example of the circuit that results from the corresponding stage of fabrication. Thus, FIG. 8 illustrates the progression of initially starting with a substrate for an IC chip, through forming the individual photonic devices, and ultimately to a completely fabricate an integrated platform. As alluded to above, photonics technology is leveraged to particularly fabricate each of the photonic devices in manner that allows their optimization and full integration onto the platform. Process 900 is illustrated as a series of executable operations performed by processor 901, which can be an machine programmed to perform manufacturing, which as the fabrication of an IC chip, as described above. Processor 901 executes the operations of process 900, thereby implementing fabrication of the disclosed DWDM PIC, as disclosed herein.

The process can begin at operation 905, where a silicon layer of the photonic integrated circuit (PIC) is patterned to create passive circuits. For example, a silicon layer can be patterned to create passive waveguide circuits. In some cases, the silicon layer may be patterned in order to achieve multiple levels of optical waveguide confinement (e.g., 220 nm, 150 nm, 70 nm).

Operation 905 can also involve doping the silicon by implantation, in order for the intrinsic silicon to be converted to either p-type silicon or n-type silicon.

Next, the process continues to operation 810 in order to form the multiple device sections of the PIC. During operation 810, bonding trench formation can be performed, where a silicon layer of the substrate is etched. The etching can remove enough silicon to expose a lower substrate layer of buried oxide (BOX), which electrically isolates different regions of the substrate. Thus, the bonding trenches effectively form separate sections of the PIC, where each section is defined by its boundary that has been outlined by a trench. Each of the multiple sections of the PIC, being electrically isolated from one another, further delineates a region on the PIC that can be used for fabricating a corresponding photonic component thereon.

Operations 905 and 910 are also depicted in FIG. 8. That is, circuit 805 is an example of the circuit that is created from creating the passive circuit, doped silicon to create p-type (P++) and n-type (N++) silicon, isolation/bonding trench formation stage in the fabrication. Circuit 805 illustrates the fabrication platform can start with a Silicon-On-Insulator (SOI) wafer that can be made with a buried oxide (BOX) and a top silicon layer.

Referring back to FIG. 9, the process 900 can continue to operation 915 for forming the SiGe section of the PIC. The SiGe section delineates an area for fabricating a SiGe APD. Accordingly, in order to form the SiGe layer, operation 915 can involve selective Si and Ge epitaxy. Epitaxy can grow the material layer-by-layer in a reactor, for example, which requires extremely high temperatures. These temperatures concerns related to epitaxy lends itself to be an early stage in the fabrication process 900, and further allows the structure needed for the SiGe APDs to be grown throughout fabrication of the PIC. In some cases, the growth region associated with the selective epitaxy can be reshaped, according to a particular design characteristic. For example, the size, length, width of the region can be selectively adjusted, and designated based on desired characteristics of the SiGe APDs. Furthermore, operation 815 can involve formation of the SiGe mesa and p electrodes. Furthermore, operation 815 can involve formation of the SiGe mesa and p electrodes.

In FIG. 8, circuit 810 illustrates an example of a circuit that can result from the Si and Ge selective epitaxy in the SiGe section of the PIC. Circuit 815 shows the circuit 805 after forming the SiGe mesa and p electrode. As seen, circuit 805 can include a p-type metal that is placed on top of the Ge.

Continuing with FIG. 9, the process 900 can then form the laser section of the PIC in operation 920. The laser section can delineate an area for fabricating a QD laser with an integrated H-MOS. In order to achieve this integration of the QD laser with integrated H-MOS onto the platform, process 920 includes wafer bonding III-V on top pf the silicon, selectively, in order to avoid the SiGe area. In some cases, characteristics of the III-V material can be selectively adjusted based on certain design characteristics. For example, there may be different sizes of III-V material that is wafer bonded to the silicon. Also, during wafer bonding of the III-V, H-MOS capacitor dielectric can be deposited. The dielectric can be deposited before III-V physically contacts the silicon layer. Thus, once these layers have been contacted, areas of direct contact between the III-V layer and the silicon layer form a MOS capacitor component that can be integrated into the QD laser. Then, after the MOS capacitor structure is formed (from the H-MOS dielectric) proton implantation can be performed in the laser section.

Proton implantation may be used to neutralize some of the p-type and n-type doped silicon. Often times, convention laser structures use a uniformly doped material during growth of its layers. In a similar fashion, the doping of operation 920 allows the QD laser to be formed on an region of uniformly doped material. This allows for contacts to be placed at the bottom and top of the QD laser, such that an electrode can be formed (then an electrode carrier driven into the region, where the light is recombined and imaged). The doping causes the layer to be non-conductive, which forces the injection current to flow in the laser region. Then, after the III-V material is wafer bonded to the silicon layer of the substrate (e.g., SOI), the area of the III-V material can be reshaped to form the specific dimensions of the QD laser with H-MOS integration. Shaping the III-V layer to construct the QD laser can involve removing some portions of III-V material from the layer. However, all of the III-V material is not removed, allowing a thin layer of III-V material to remain on top of the silicon after shaping the III-V layer. Those regions where the thin layer of III-V contacts the silicon will have a MOS capacitance, and can be used to form the MOS modulators and the grating coupler (having a III-V overlay). Furthermore, forming the laser section in operation 920 can include further forming the p-type electrode and the mesa for the QS laser. As an example, the p-type electrode can be placed on top of the III-V layer.

An important concept with respect to integrating the QD laser involves the complexities of wafer bonding III-V on top of a substrate having SiGe layered thereon. In general, a planar surface is used to fabricate an on-chip laser, which mitigates any alignment issues. However, the DWDM PIC architecture includes SiGe APDs, which requires a layer of SiGe (e.g., partially formed SiGe APDs causes the platform to no longer be a flat planar surface). Consequently, aligning the lasing material becomes a consideration in the fabrication 900, particularly during operation 920. That is, III-V cannot be bonded on top of the SiGe layer, and thus requires positioning the III-V material in an area of the platform that has a flat surface which is also devoid of SiGe. Therefore, achieving the integration of both the SiGe APDs and the QD laser on the same platform (e.g., on-chip) is an innovative technique that is not used in existing transceiver chips. Nonetheless, is should also be appreciated that a fabrication process that may be used to implement the DWDM PIC with an off-chip QD laser with integrated H-MOS (shown in FIG. 1B) is also innovate. The fabrication process may be simplified by implementing an off-chip design, as there is no concerns for forming the laser. However, even in the case of the off-chip laser, III-V material is bonded to the platform to form the H-MOS structure used by the H-MOS micro-ring modulators and the H-MOS wavelength splitters. Thus, fabricating the DWDM PIC with an off-chip QD laser still involves the challenges associated with bonding III-V to SOI.

Operation 920 can also include forming a photodetector section. The photodetector section can delineate an area for fabricating a QD photodetector with integrated H-MOS. Generally, the QD laser and QD photodetector share the same fabrication process. The difference arises in operation, where the QD laser is forward bias and photodetector is reverse bias. The QD photodetector can serve as a monitor APD in the receiver section of the DWDM PIC (shown in FIG. 1A). In some cases, implementing the QD photodetector may eliminate the need for the SiGe APDs. The PIC may be fabricated primarily from III-V bonding, in this case, as there is no need for the SiGe process used to form the SiGe APDs. A PIC having QD photodetectors instead of SiGe APDs may be a simplified fabrication process, in comparison to process 900 (which involves SiGe selective epitaxy).

Again, referring back to FIG. 8, circuit 820 depicts the results from the abovementioned stages of fabrication. As seen, circuit 820 includes a III-V layer that is wafer bonded to the silicon layer of the substrate, in a manner that completely avoids the SiGe section. Also, circuit 820 illustrates QD epilayer transfer, which is the H-MOS capacitor structure formation. For example, circuit 820 shows a thin layer of the H-MOS gate dielectric that is between the III-V material and the substrate. Circuit 825 depicts the shaped QD laser with H-MOs integrated H-MOS, resulting from removing some material of the III-V layer that was placed during bonding. Circuit 825 also shows formation of the p-type electrode on top of the QD laser, and the formation of its mesa.

In FIG. 9B the fabrication process continues to operation 930. An H-MOS section of the PIC can be formed during operation 930, which delineates an area for fabricating an H-MOS micro-ring modulator and an H-MOS wavelength splitter. Formation of these devices can be can be based on the previously contacted the H-MOS dielectric and silicon layer, which can then be patterned to form the structures for the H-MOS micro-ring modulator, and the MOS wavelength splitter. Thereafter, at operation 935 in the process 900, a HGC section of the PIC can be formed, delineating an area for fabricating the HGC. In other words, patterning can be used to define the structural dimensions for the HGC, as well as the H-MOS wavelength splitter and H-MOS micro-ring modulator (formed in operation 930). In FIG. 8, these stages of the fabrication are depicted by the resulting circuit 830. Circuit 830 illustrated the formed H-MOS micro-ring modulator (filter) and HGC integrated onto the platform.

Referring back to FIG. 9B, a next operation 945 can involve forming N-type electrodes on certain photonic devices formed on the platform, as deemed appropriate. For instance, the N-type contacts can be added to the QD laser and the H-MOS micro-ring modulator (filter) in operation 945. It should be understood that at this stage in fabrication, the P-type contacts have already been placed on the QD laser and the SiGe APDs. Hence, N-type contacts are formed in this stage. Forming the N-type electrodes is depicted in FIG. 8 by circuit 835. Circuit 835 illustrated the formed N-type contacts that have been placed on the QD laser and the SiGe APDs.

In FIG. 9, the fabrication process can move to operation 945 where any residual III-V material is removed. Additionally, P-type and N-type electrodes can be formed on certain sections of the exposed silicon layer. In some cases, contacts for the photonic devices can be on top of the encapsulation. This stage in the fabrication corresponds to circuit 840 shown in FIG. 8.

Fabrication of the DWDM PIC may conclude at operation 950, where each of the device sections are individually encapsulated. In some cases, a polymer dielectric is used for encapsulation, which can protect the photonic devices within (e.g., from debris, damage, and contaminants). This final stage in the fabrication corresponds to circuit 845 in FIG. 8. Circuit 840 depicts an example of the DWDM PIC having an on-chip QD integrated H-MOS laser, having each of the individual device sections encapsulated and the metal contact pads added. The circuit 845 can then be used in the manufacturing of other optical communication products. For instance, circuit 840 can be an IC chip that can be packaged in a board or into a module, like other semiconductor chips. Accordingly, the disclosed embodiments can realize the DWDM PIC as a fully integrated "on-chip" solution, manufactured on a single platform. Even further, the DWDM PIC implements a DWDM transceiver having low optical loss, high energy efficiency, large data bandwidth, while maintaining low integration costs.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method for fabricating a photonic integrated circuit (PIC), comprising:

forming multiple device sections of the PIC for an integrated fabrication of multiple photonic devices on a substrate of the PIC, wherein each of the multiple device sections delineates a growth region on the PIC for a corresponding photonic device thereon and each of the multiple device sections are electrically isolated by etching a silicon layer of the PIC;

forming a silicon geranium (SiGe) section in one of the multiple device sections of the PIC, wherein the SiGe section delineates an area for fabricating a SiGe avalanche photodetector (APD);

forming a laser section in one of the multiple device sections of the PIC, wherein the laser section delineates an area for fabricating a quantum dot (QD) laser with integrated heterogeneous metal oxide semiconductor (H-MOS);

forming a photodetector section in one of the multiple sections of the PIC, wherein the photodetector section delineates an area for fabricating a heterogenous QD metal oxide semiconductor (MOS) photodetector;

forming a MOS section in one of the multiple device sections of the PIC, wherein the MOS section delineates an area for fabricating a MOS micro-ring modulator and a H-MOS wavelength splitter; and forming a heterogeneous grating coupler (HGC) section in one of the multiple device sections of the PIC, wherein the MOS section delineates an area for fabricating an HGC.

2. The method of claim 1, wherein fabricating the SiGe avalanche photodetector (APD) in the silicon geranium (SiGe) section of the PIC comprises:

forming a SiGe layer using selectively epitaxy in the SiGe section of the PIC; and reshaping the SiGe layer to form structural dimensions of the SiGe APD.

3. The method of claim 2, wherein fabricating the QD laser with integrated H-MOS in the laser section of the PIC comprises:
   depositing an H-MOS capacitor dielectric;
   wafer bonding a III-V layer on top of the silicon layer of the PIC;
   implanting protons to create a uniform doping of the layers in the laser forming section; and
   reshaping the III-V layer to pattern a mesa of the QD laser with integrated H-MOS.

4. The of method of claim 3, wherein the wafer bonding selectively integrates the III-V layer in manner that avoids direct contact with the SiGe section of the PIC and selectively aligns the III-V layer and materials for forming the QD laser with integrated H-MOS on a planar surface of the PIC.

5. The method of claim 4, wherein the H-MOS dielectric allows for an area of direct contact between the III-V layer and the silicon layer to form a H-MOS capacitor component which is comprised by the QD laser with integrated H-MOS.

6. The method of claim 5, wherein fabricating the MOS micro-ring modulator and the H-MOS wavelength splitter in the MOS section comprises:
   creating a first portion of a thin overlay layer that remains from removing portions of the III-V layer in the MOS section, wherein areas of direct contact between III-V material of the first portion of the thin overlay layer and the silicon layer of the PIC forms MOS capacitance;
   forming the MOS micro-ring modulator using the first portion of the thin overlay layer having MOS capacitance; and
   forming the H-MOS wavelength splitter using the first portion of the thin overlay layer having MOS capacitance.

7. The method of claim 6, wherein fabricating the HGC in the HGC section comprises:
   creating another portion of the thin overlay layer that remains from removing portions of the III-V layer material in the HGC section, wherein areas of direct contact between III-V material of the second portion of the thin overlay layer and the silicon layer of the forms MOS capacitance; and
   forming the HCG using the thin overlay layer having MOS capacitance.

8. The method of claim 7, further comprising:
   forming p-type and n-type electrodes on the laser section; and
   forming p-type electrodes on the MOS section for the MOS micro-ring modulator.

9. The method of claim 8, further comprising:
   removing residual III-V material from the PIC;
   encapsulating each of the laser section, the MOS section, the HGC section, and the SiGe section.

10. The method of claim 1, wherein the photonic integrated circuit comprises a dense wavelength division multiplexing (DWDM) transceiver circuit.

11. A photonic integrated circuit (PIC), comprising:
   a silicon geranium (SiGe) section including a SiGe avalanche photodetector (APD) fabricated thereon;
   a laser section including a quantum dot (QD) laser with integrated heterogenous metal oxide semiconductor (H-MOS) laser fabricated thereon;
   a photodetector section including a photodetector thereon;
   an H-MOS section including an H-MOS micro-ring modulator and an H-MOS wavelength splitter fabricated thereon; and
   a heterogeneous grating coupler (HGC) including an HGC fabricated thereon.

12. The PIC of claim 11, wherein the laser sections includes III-V material wafer bonded onto a silicon layer of the PIC for fabricating the QD laser with integrated H-MOS.

13. The PIC of claim 12, wherein the QD laser with integrated H-MOS is a symmetric comb laser that generates two equal outputs for generating an increased number of multi-wavelength streams of light.

14. The PIC of claim 13, further comprising:
   an H-MOS demultiplexer (DEMUX) fabricated thereon, wherein the H-MOS DEMUX comprises an integrated H-MOS capacitor for athermally routing channels to a corresponding SiGe APD.

15. The PIC of claim 14, wherein the H-MOS wavelength splitter comprises an integrated H-MOS capacitor for athermally generating an increased number of multi-wavelength streams of light.

16. The PIC of claim 15, wherein the HGC comprises an overlay of III-V material for increasing coupling efficiency and spectral bandwidth of the multi-wavelength streams of light towards an optical fiber.

17. The PIC of claim 11 wherein the photodetector is a monitor photodetector comprising a SiGe APD or a QD photodetector.

18. The PIC of claim 17, wherein the SiGe APD is a receiving photodetector.

19. A photonic integrated circuit (PIC), comprising:
   a photodetector section including a quantum dot (QD) photodetector fabricated thereon:
   a laser section including a QD laser with integrated heterogeneous metal oxide semiconductor (H-MOS) fabricated thereon;
   an H-MOS section including an H-MOS micro-ring modulator and an H-MOS wavelength splitter fabricated thereon; and
   an heterogeneous grating coupler (HGC) including an HGC fabricated thereon.

* * * * *